(12) United States Patent
Bartos et al.

(10) Patent No.: US 11,280,851 B2
(45) Date of Patent: Mar. 22, 2022

(54) ASSEMBLY AND METHOD FOR DETERMINING THE STRENGTH OF A MAGNETIC STRAY FIELD

(71) Applicant: TE Connectivity Sensors Germany GmbH, Dortmund (DE)

(72) Inventors: Axel Bartos, Waltrop (DE); Armin Meisenberg, Dortmund (DE)

(73) Assignee: TE CONNECTIVITY SENSORS GERMANY GMBH, Dortmund (DE)

( * ) Notice: Subject to any disclaimer, the term of this patent is extended or adjusted under 35 U.S.C. 154(b) by 25 days.

(21) Appl. No.: 16/894,103

(22) Filed: Jun. 5, 2020

(65) Prior Publication Data

US 2021/0048490 A1     Feb. 18, 2021

(30) Foreign Application Priority Data

Aug. 14, 2019   (EP) ..................................... 19191633

(51) Int. Cl.
| | | |
|---|---|---|
| *G01R 33/032* | (2006.01) | |
| *G01R 33/00* | (2006.01) | |
| *G01R 33/025* | (2006.01) | |

(52) U.S. Cl.
CPC ....... *G01R 33/032* (2013.01); *G01R 33/0076* (2013.01); *G01R 33/025* (2013.01)

(58) Field of Classification Search
CPC .............. G01R 33/032; G01R 33/0076; G01R 33/025; G01R 33/096; G01R 33/038; G01R 33/0005; G01R 33/0017; G01R 33/09; G01R 33/02; G01D 5/145
USPC .................................................... 324/207.12
See application file for complete search history.

(56) References Cited

U.S. PATENT DOCUMENTS

| | | | | |
|---|---|---|---|---|
| 10,368,680 | B2* | 8/2019 | Ryan ..................... | A47J 36/165 |
| 2004/0017353 | A1* | 1/2004 | Anton ................... | G06F 3/0346 345/156 |
| 2009/0309583 | A1* | 12/2009 | Ruetz ................. | B62D 15/0215 324/207.25 |
| 2014/0312891 | A1* | 10/2014 | Micheau-Cunningham ............... | G01N 27/9006 324/242 |
| 2015/0192646 | A1* | 7/2015 | Shin ...................... | G01C 17/04 324/259 |
| 2018/0087889 | A1 | 3/2018 | Ausserlechner et al. | |

(Continued)

OTHER PUBLICATIONS

Extended European Search Report, European Application No. 19191633. 7-1010, European Filing dated Feb. 10, 2020.

*Primary Examiner* — Christopher P McAndrew

(57) ABSTRACT

An assembly includes a permanent magnet generating a magnetic field. The permanent magnet is arranged on the rotary member and generates a magnetic field perpendicular to an axis of rotation. A first channel has a first magnetic sensing element centered on the axis of rotation, the first channel providing a first angular data. A second channel has a second magnetic sensing element centered on the axis of rotation, the second channel providing a second angular data. The second magnetic sensing element is spaced from the first magnetic sensing element. Each of the first magnetic sensing element and the second magnetic sensing element have three voltage dividers. A processor computes a magnetic stray field component orthogonal to the magnetic field by comparing a first field strength based on the first angular data with the second field strength based on the second angular data.

20 Claims, 6 Drawing Sheets

(56) References Cited

U.S. PATENT DOCUMENTS

2018/0184837 A1\* 7/2018 Ryan ................. A47J 27/004
2018/0238711 A1\* 8/2018 Zimmer .............. G01D 5/145
2018/0299298 A1\* 10/2018 Ando ................ G01D 5/2073
2019/0017864 A1   6/2019 Marauska et al.

\* cited by examiner

ASSEMBLY AND METHOD FOR DETERMINING THE STRENGTH OF A MAGNETIC STRAY FIELD

CROSS-REFERENCE TO RELATED APPLICATION

This application claims the benefit of the filing date under 35 U.S.C. § 119(a)-(d) of European Patent Application No. 19191633, filed on Aug. 14, 2019.

FIELD OF THE INVENTION

The present invention relates to a magnetic stray field and, more particularly, to determining the strength of a magnetic stray field in a magnetic senor detecting a rotational angle of a rotary member.

BACKGROUND

Generally, magnetoresistive sensors (also referred to in this application as magnetic sensors) measure the direction of magnetic fields. Such arrangements and methods find use in the art of determining angles and positions in the context of magnetic field sensors, particularly those utilizing magnetoresistive effects.

The sensors make use of the magnetoresistive effect, which is the tendency of a material (e.g. ferromagnetic) to change the value of its electrical resistance in an externally applied magnetic field. In particular, multicomponent or multilayer systems (e.g. magnetic tunnel junctions), giant magnetoresistance (GMR), tunnel magnetoresistance (TMR), colossal magnetoresistance (CMR), and extraordinary magnetoresistance (EMR) observe magnetoresistance, while the anisotropic magnetoresistive effect (AMR) needs only one layer to occur.

The externally applied field can be generated by a permanent magnet, which is an object made from a material that is magnetized creating its own persistent magnetic field. In the case of a magnetic sensor, detecting a rotational angle of a rotary member, the permanent magnet is attached to the rotary member connected to a rotating axis and the sensor element is opposing the magnet. Since the field induced by the permanent magnet is time invariant, the direction of the magnetic field is only determined by the orientation of the rotating component relative to the sensing element.

Magnetic sensors provide an outstanding angle accuracy as well as a high robustness against challenging environmental conditions and play an important role in various applications such as manufacturing and transportation applications. In more detail, magnetoresistive angle sensors are important components because of their low intrinsic measurement error and high stability. Additionally, the favorable temperature characteristic as well as the robustness against harsh environmental conditions leads to the relevance of magnetoresistive (MR) sensors in many important applications. Exemplifying the automotive domain, MR angular sensors are used in electronic power steering, wiper or throttle valve systems as well as engine applications.

However, disturbing fields interfering the field of the permanent magnet can significantly influence the measurement, which may have effects on accuracy of the measurement and the safety of the application.

In particular, future sensors must be robust up to 3 kA/m disturbing fields. For automotive applications a magnetoresistive sensor must conform the norm ISO11452-8, which is incorporated by reference [ISO 11452-8:2015-06 Road vehicles—Component test methods for electrical disturbances from narrowband radiated electromagnetic energy—Part 8: Immunity to magnetic fields]. In particular, this standard requires in annex "A.2.3 External field", Table A.2, at Test level IV and 0 Hz a sensor robustness of 3 kA/m.

The robustness against disturbing fields can be addressed, for example, by shielding external magnetic fields or by using field gradients for the angular measurement. Such solutions, however, can increase the system costs significantly. To minimize the impact of stray fields with a high magnitude, unacceptable large and strong disc or block magnets based on expensive materials have to be used.

According to an alternative solution, the disturbing fields can be detected and corrected. A need remains, however, for an assembly for determining accurately the influence of a magnetic stray field in a magnetic sensor detecting a rotational angle of a rotary member.

SUMMARY

An assembly includes a permanent magnet generating a magnetic field. The permanent magnet is arranged on the rotary member and generates a magnetic field perpendicular to an axis of rotation. A first channel has a first magnetic sensing element centered on the axis of rotation, the first channel providing a first angular data. A second channel has a second magnetic sensing element centered on the axis of rotation, the second channel providing a second angular data. The second magnetic sensing element is spaced from the first magnetic sensing element. Each of the first magnetic sensing element and the second magnetic sensing element have three voltage dividers. A processor computes a magnetic stray field component orthogonal to the magnetic field by comparing a first field strength based on the first angular data with the second field strength based on the second angular data.

BRIEF DESCRIPTION OF THE DRAWINGS

The invention will now be described by way of example with reference to the accompanying Figures, of which.

DETAILED DESCRIPTION OF THE EMBODIMENTS

The accompanying drawings are incorporated into the specification and form a part of the specification to illustrate several embodiments of the present invention. These drawings, together with the description, serve to explain the principles of the invention. The drawings are merely for the purpose of illustrating examples of how the invention can be made and used, and are not to be construed as limiting the invention to only the illustrated and described embodiments.

Furthermore, several aspects of the embodiments may form-individually or in different combinations-solutions according to the present invention. Further features and advantages will become apparent from the following more particular description of the various embodiments of the invention as illustrated in the accompanying drawings, in which like references refer to like elements.

Figure 1:
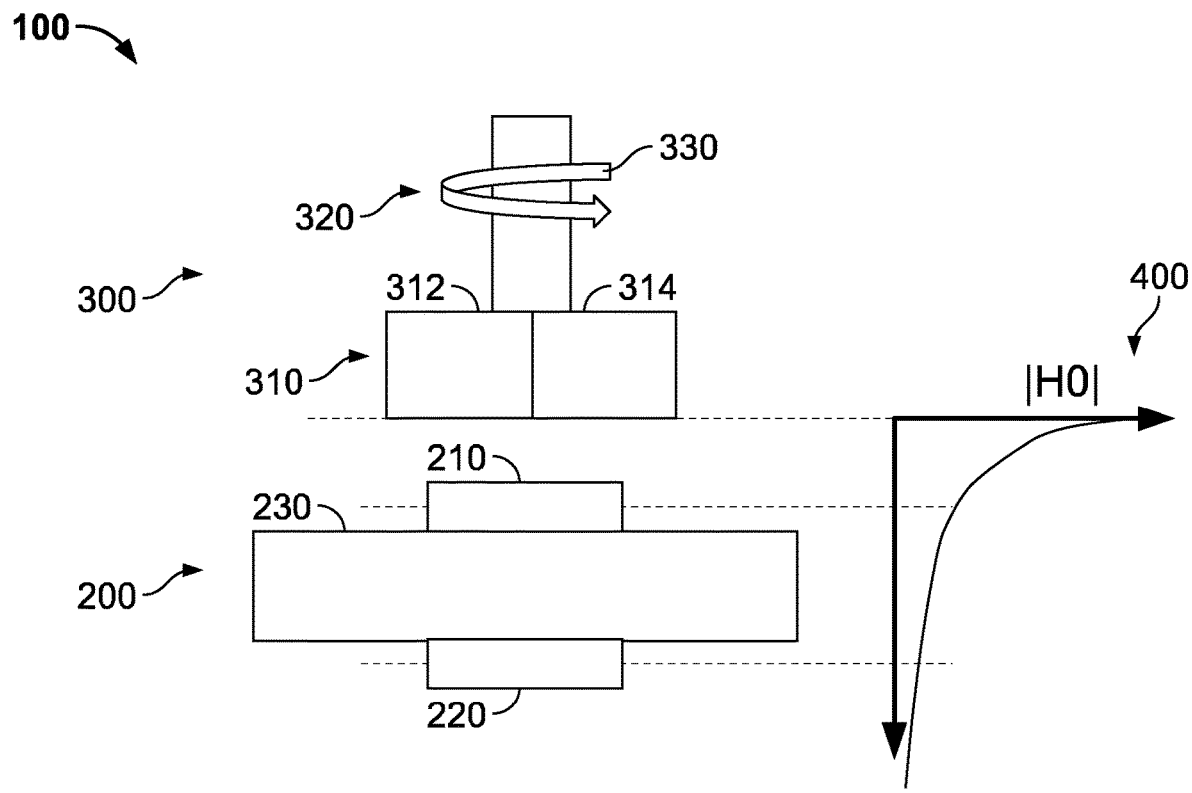
FIG. 1 is a schematic diagram of an assembly for determining and compensating a magnetic stray field influence in a magnetic sensor detecting a rotational angle of a rotary member.

An assembly 100 for determining a strength and influence of an external disturbing magnetic stray field in a magnetic sensor 200 detecting a rotational angle ω of a rotary member 300 is shown in FIG. 1.

The magnetic sensor 200, as shown in FIG. 1, includes a first magnetic sensing element 210 and a second magnetic sensing element 220. The first magnetic sensing element 210 and the second magnetic sensing element 220 are connected to a circuit board 230, for example a printed circuit board.

The rotary member 300, as shown in FIG. 1, includes a permanent magnet 310 attached to a rotating shaft 320. The rotary member 300 rotates around an axis of rotation, indicated by arrow 330. The permanent magnet 310 is magnetized in a direction extending from the axis of rotation thereby forming a magnetic south pole 312 and a magnetic north pole 314.

The first and second magnetic sensing element 210, 220 and the permanent magnet 310 are arranged on the axis of rotation, as shown in FIG. 1. The first and second magnetic sensing elements 210, 220 extend in a plane perpendicular to the axis of rotation. The first and second sensing element 210, 220 are arranged apart from the magnet 310 at a predetermined distance and the first sensing element 210 is spaced apart from the second sensing element 220 at a predetermined distance.

The resulting magnetic field H0 is indicated by diagram 400 in FIG. 1. The amount of the magnetic field H0 of the permanent magnet 310 is decreasing in the direction towards the first and second magnetic sensing element 210, 220.

Figure 2:
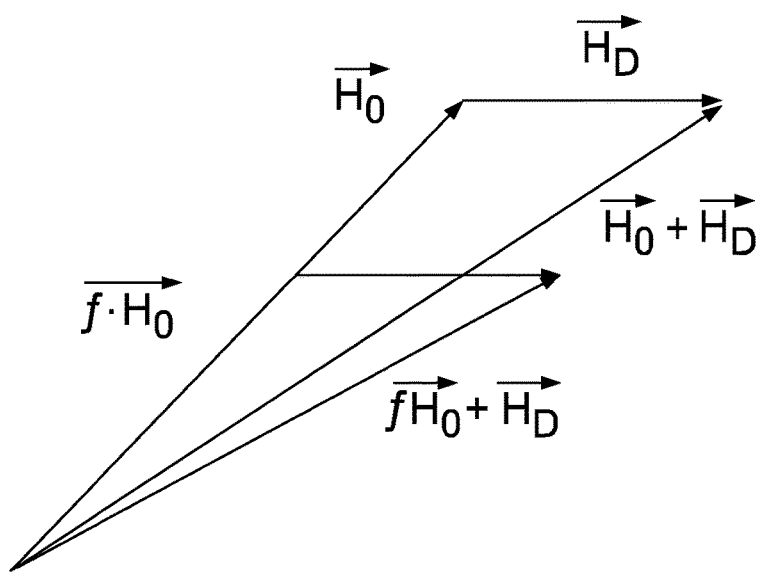
FIG. 2 is a vector diagram of a plurality of magnetic fields.

FIG. 2 shows a vector diagram of the magnetic fields, and the influence of an interfering disturbing magnetic stray field HD is shown. The vector H0 indicates the magnetic field of the permanent magnet 310 in the plane of the first magnetic sensing element 210. The vector f×H0 indicates the magnetic field of the permanent magnet 310 in the plane of the second magnetic sensing element 220. The disturbing field is indicated by the vector HD. In particular, this diagram is based on the assumption that the distance between the assembly 100 and the source of the disturbing field is greater than the dimensions of the assembly 100, in particular the distance between the permanent magnet 310 and the second magnetic sensing element 220. Thus it can be assumed that the direction and the strength of the field of the disturbing source is homogeneous within the assembly 100. In general, this assumption holds true. However, if this assumption would not hold true, the strength of the disturbing field may be determined based on more advanced calculations.

By measuring the strength of the interfering field f×H0+HD with the second magnetic sensing element 220 and measuring the interfering field H0 plus HD with the first magnetic sensing element 210 the strength of the influence of the interfering field of the disturbing source can be computed and the influence can be compensated for the angle measurement.

Figure 3:
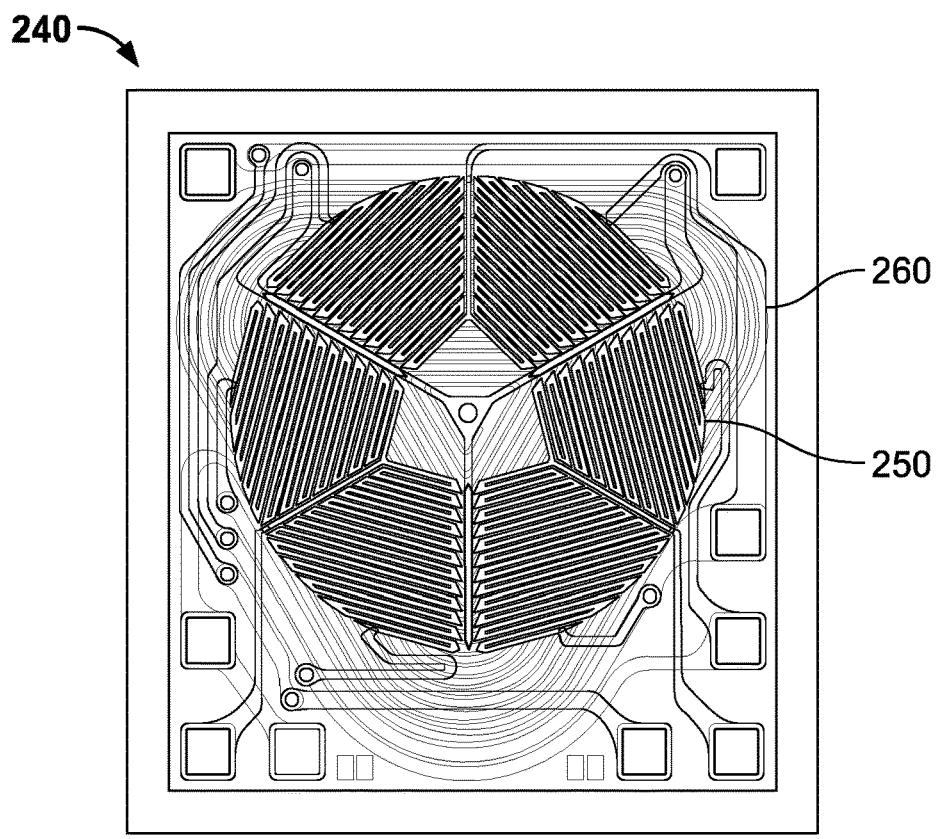
FIG. 3 is a top view of an integrated circuit including a sensing element and a coil.

FIG. 3 shows a schematic view of an integrated circuit 240 comprising an AMR-sensing element 250 and a coil 260. The sensing element 250 is equivalent to the first magnetic sensing element 210 and the second magnetic sensing element 220. The sensing element 250 is arranged in one layer of the integrated circuit 240 and in another abutting layer the coil 260 is arranged. According to one embodiment, each of the first magnetic sensing element 210 and the second magnetic sensing element 220 is fabricated with the coil 260 to form the integrated circuit 240 shown in FIG. 3, thereby forming a first die and a second die.

Figure 4:
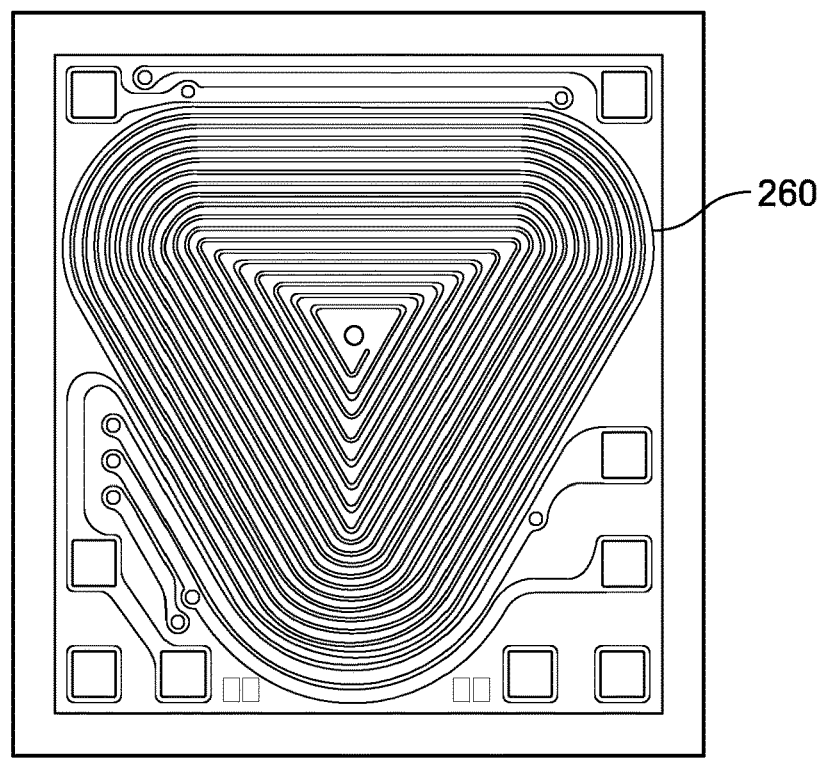
FIG. 4 is a detail view of the coil of FIG. 3.

FIG. 4 shows a detailed view of the layer comprising the coil 260 of the integrated circuit of FIG. 3. The coil 260 has a plurality of windings arranged around the axis of rotation. The coil 260 contacts by a first contacting point the center of the integrated circuit 240. The windings of the coil 260 are arranged spirally around the contacting point, wherein each winding generally follows the shape of a triangle. The windings of the coil 260 are arranged in a layer of the integrated circuit 240. According to the shown embodiment of the coil 260, the corners of each triangle forming a winding are rounded, thereby minimizing the space requirements of the coil 260.

Figure 5:
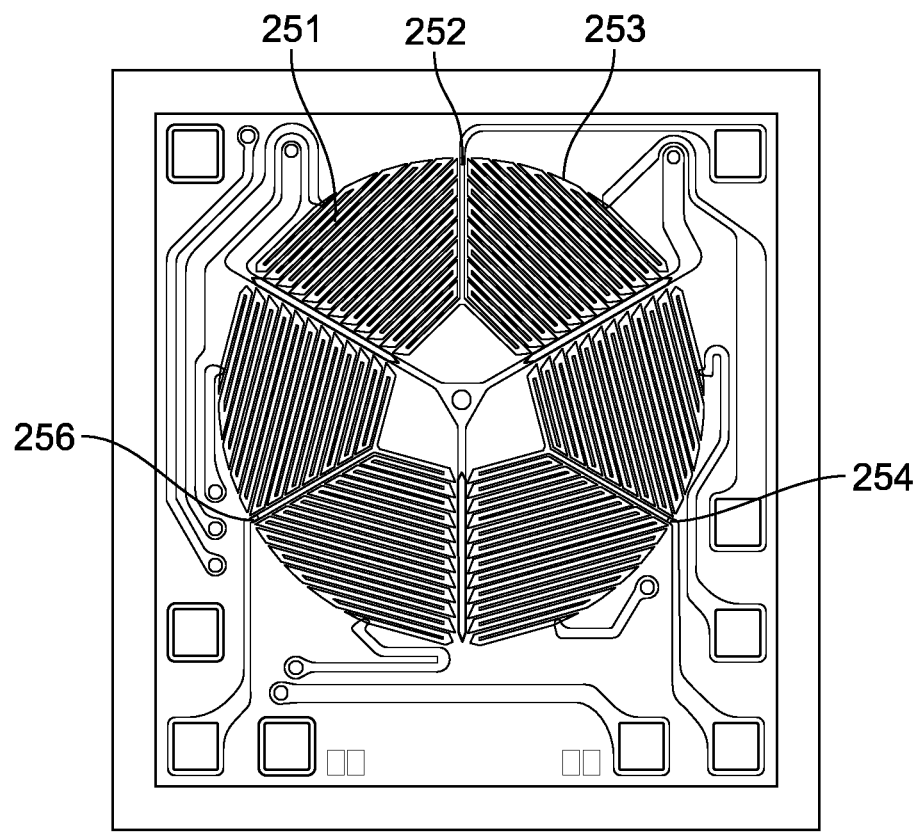
FIG. 5 is a detail view of the sensing element of FIG. 3.

FIG. 5 shows an arrangement of the sensing element 250 of the integrated circuit 240 of FIG. 3. The sensing element 250 has a plurality of voltage dividers 252, 254, 256. The three voltage dividers 252, 254, 256 are arranged in a plane of the integrated circuit 240. That is, in an embodiment, each of the first magnetic sensing element 210 and the second magnetic sensing element formed by the integrated circuit 240 have three voltage dividers 252, 254, 256. The voltage dividers 252, 254, 256 are symmetrically distributed in one layer of the integrated circuit 240. The angle between two abutting voltage dividers 252, 254, 256 is 120° in the shown embodiment.

In the shown embodiment, the three voltage dividers 252, 254, 256 are formed similarly. Exemplary, a first voltage divider 252 is described in detail. The first voltage divider 252 has a first resistor 251 and a second resistor 253. A first end of the resistors 251, 253 is interconnected and the second end of the resistors 251, 253 are connected to contact pads, which enable the electrical connection to supply voltage and signal evaluation unit.

Magnetoresistive strips arranged in the layer in a sensor plane form the resistors 251, 253. The magnetoresistive layers of the resistors 251, 253 have opposing resistance changes in the magnetic field. The magnetoresistive strips are connected, forming conducting paths. Thus, the field direction of the permanent magnet can be measured. Each of the voltage dividers 252, 254, 256 has a first conducting path forming a first resistor 251 of the pair of resistors 251, 253 and a second conducting path arranged perpendicular to the first conducting path and forming a second resistor 253 of the pair of resistors 251, 253. The second conducting path supplies an inverse resistance change compared to the first conducting path forming a second resistor. Thus, the phase angle between the two resistors forming one half bridge is optimized thereby increasing the signal strength and thereby further reducing the sensor size in a plane perpendicular to the axis of rotation.

In particular, each path meanders from a central portion of the integrated circuit 240 to an external portion of the integrated circuit. The path is formed by longer parallel sections and shorter sections that are shorter that the longer sections. The shorter sections are generally extending in the direction from the central portion of the integrated circuit 240 to the extent a portion of the integrated circuit 240. Parallel sections of a first resistor 251 are arranged perpendicular to parallel sections of a second resistor 253. Resistors forming one voltage divider that are arranged substantially perpendicular enable the measurement of the direction of the magnetic field as they react with opposing phases to changes of the magnetic field, thereby generating the measurement signal.

As shown in FIG. 3, the arrangement of the coil 260 and the arrangement of the three voltage dividers 252, 254, 256 forming the sensing element 250 is optimized so that the space requirements for the integrated circuit 240 are minimized.

The three voltage dividers 252, 254, 256 permit an optimized arrangement, namely that the size of the sensor in the dimension of the sensor plane is reduced compared to a sensor consisting of an even number of voltage dividers. Furthermore, three voltage dividers provide a spare measurement signal. In other words, sensors having three voltage dividers provide similar advantages as a three-wire three-phase circuit compared to an equivalent two-wire two-phase circuit at the same line to ground voltage. In particular, less sensor size is needed to receive a given amount of signal strength.

A reduced size of the sensing element 210, 220 in the plane perpendicular to the axis of rotation is advantageous as thus the requirements for the magnetic field generated by the permanent magnet 310 can be relaxed. In more detail, for measuring the angle requires that the field of the permanent magnet 310 is homogenous in the sensing plane. However, for determining the strength of the field of the disturbing source, the magnetic field strength generated by the permanent magnet 310 has to be divergent (also referred to as inhomogeneous) along the axis of rotation. Thus, a reduced sensor size in a plane perpendicular to the axis of rotation is advantageous for an assembly that can detect and correct the field of a disturbing source. In particular, thus also the volume requirements for the magnet 310 can be relaxed.

Figure 6:
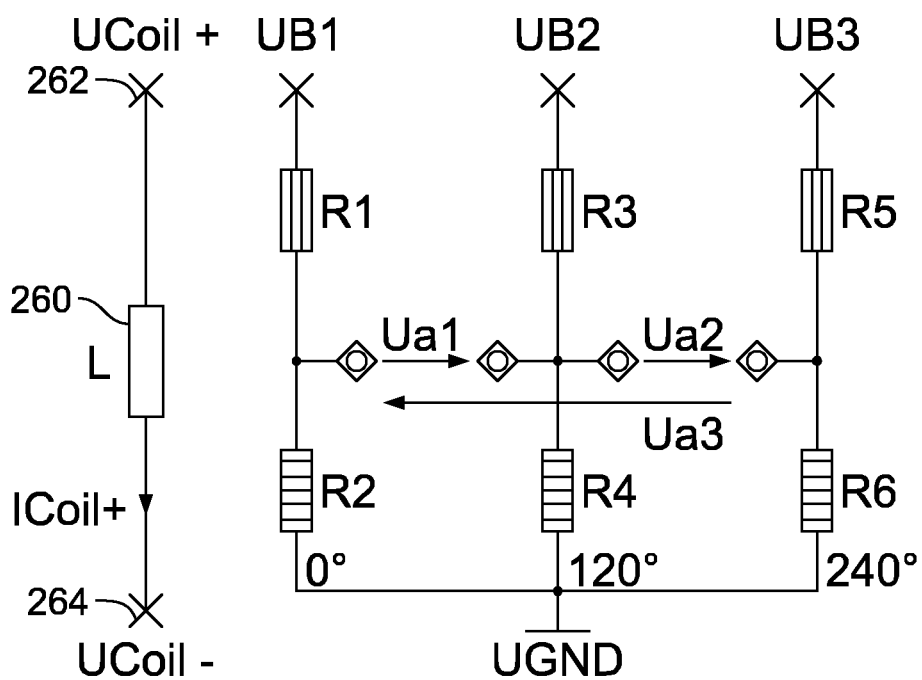
FIG. 6 is a circuit diagram of the integrated circuit of FIG. 3.

FIG. 6 shows a schematic circuit diagram of the integrated circuit 240 of FIG. 3. An induction channel comprises the coil 260 that is connected to a first contacting node 262 and the second contacting node 264. By the direction of the current applied to the induction channel, the direction of the magnetic field can be influenced. In particular, the current may be Icoil+ or in the opposing direction with Icoil−.

A measurement channel of each integrated circuit 240, shown in FIG. 6, has the three voltage dividers. Each voltage divider comprises a first end, which is connected to ground, a second end, which is connected to Ub1, Ub2 or Ub3, and a central tap. As already explained with reference to FIG. 5, the angle between two abutting voltage dividers is 120°. The central taps of two abutting voltage dividers, each of the voltage dividers forming a half bridge, are interconnected thereby forming a full bridge, in particular a Wheatstone bridge, with output voltage Ua1, Ua2, and Ua3. Thus, based on the output voltages, the angle of rotation can be determined.

A first channel of the type shown in FIG. 6 has the first magnetic sensing element 210 and a second channel of the type shown in FIG. 6 has the second magnetic sensing element 220. The angle of rotation determined by the first channel having the first magnetic sensing element 210 is output as a first angular data and the angle of rotation determined by the second channel having the second magnetic sensing element 220 is output as a second angular data.

Figure 7:
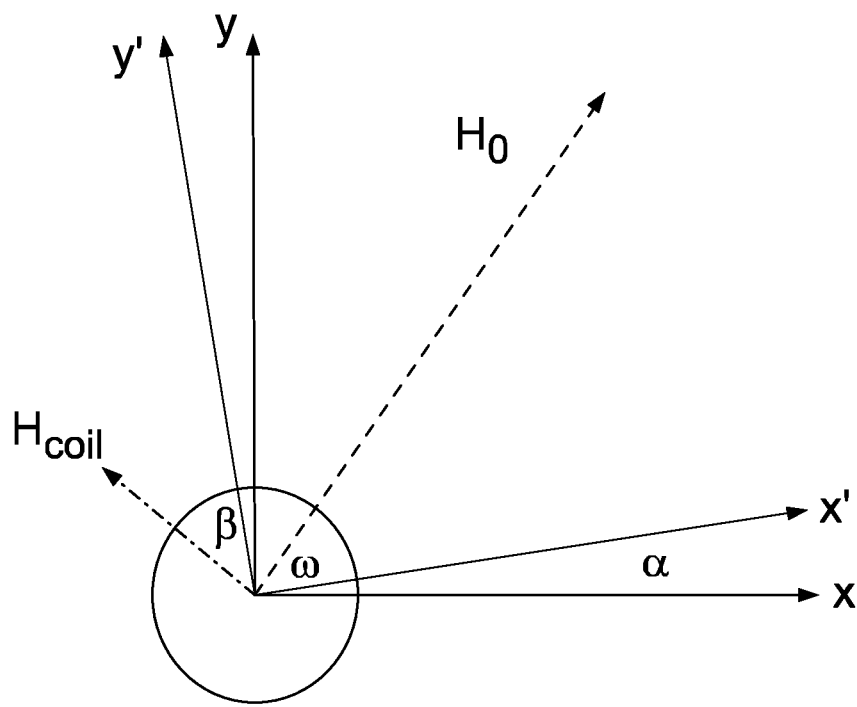
FIG. 7 is a vector diagram of the magnetic fields generated by a permanent magnet and an excitation field generated by the coil.

FIG. 7 shows a general vector diagram of the magnetic fields generated by the permanent magnet and the excitation field generated by the coil 260. The angular position ω is given by the components x and y of the magnetic field H0 in the sensing plane. Using the coil 260, which generates the field Hcoil, an additional field is induced in the sensing plane and the measured angle changes. As Hcoil is orthogonal to H0 the resulting field strength of the permanent magnet in the sensing plane can be calculated.

Figure 8:
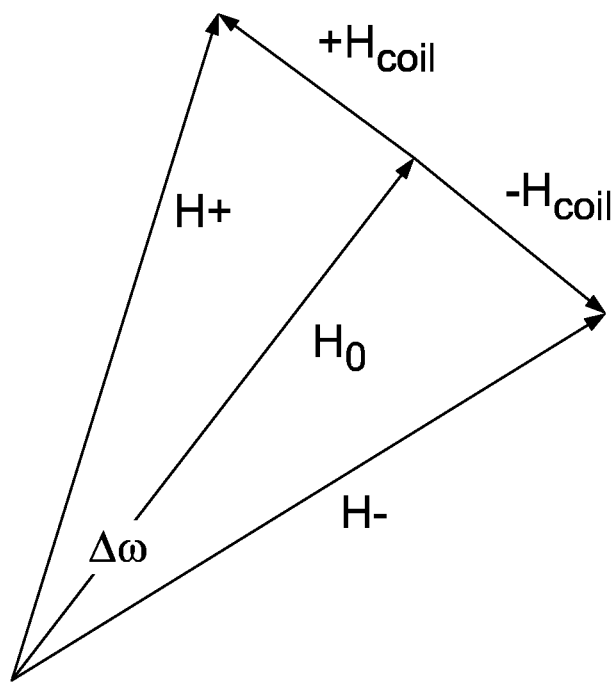
FIG. 8 is another vector diagram of the magnetic fields of FIG. 7.

FIG. 8 shows a vector diagram of the magnetic fields measured by the sensing element 210, 220 according to an embodiment. The electric current is passed in opposite directions through the inducing channel, namely by current Icoil+ and Icoil−, so that the induced field is once+Hcoil and once −Hcoil. Consequently, the effect of the induced field by the coil is maximized and the measurement to determine the field strength of the permanent magnet is optimized.

Figure 9:
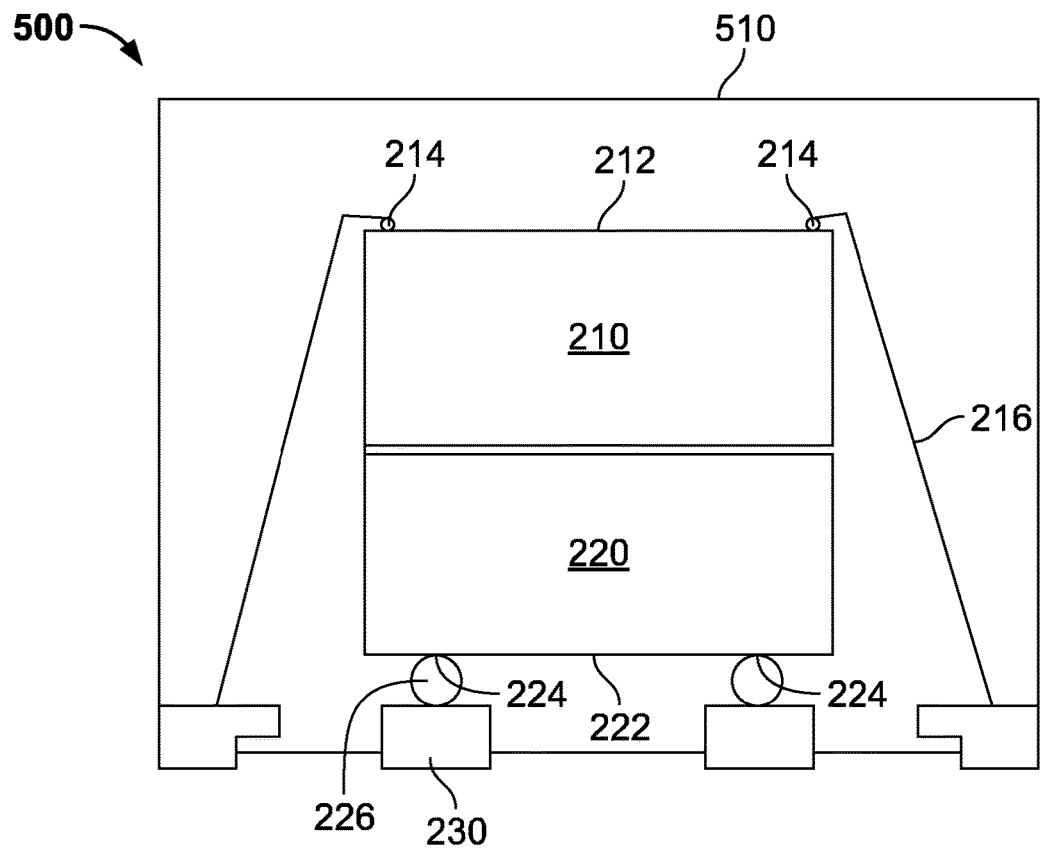
FIG. 9 is a schematic diagram of an integrated circuit package according to an embodiment.

FIG. 9 shows a schematic view of an integrated circuit package 500 according to an embodiment. The integrated circuit package 500 comprises a circuit board 230, for example a lead frame 230, a first die with the first sensing element 210, and a second die with the second sensing element 220. The first die and the second die are stacked atop one another to form the integrated circuit package 500. The integrated circuit package 500 is covered by a housing 510. A bottom contacting surface 222 of the integrated circuit package 500 faces the lead frame 230. A top contacting surface 212 of the integrated circuit package 500 faces the permanent magnet.

In an embodiment, the integrated circuit of the first sensing element 210 has a distance z of 0.2 to 0.8 mm to the integrated circuit of the second sensing element 220. In another embodiment, the first sensing element 210 has a distance z of 0.4 mm to the integrated circuit of the second sensing element 220. In an embodiment, the top contacting surface 212 has a distance of 0.2 to 0.8 mm to the bottom contacting surface 222. In another embodiment, the top contacting surface 212 has a distance of 0.4 mm to the bottom contacting surface 222. In an embodiment, a wall of the housing 510 arranged atop the first die has a thickness of 0.05 to 0.5 mm.

As shown in FIG. 9, the top contacting surface 212 has a first contact arrangement 214 and the bottom contacting surface 222 has a second contact arrangement 224. The first contact arrangement 214 is contacted by a first technique, in an embodiment by wire bonding using e.g. gold wires 216, to the lead frame 230. The second contact arrangement 224 is contacted by a second technique, in an embodiment by flip chip using e.g. solder 226 comprising tin, to lead frame 230. Such an arrangement is particularly advantageous for a compact design of the integrated circuit package 500 by maximizing the distance between the sensing planes, which are comprised in the contacting surfaces 212 and 222.

Figure 10:
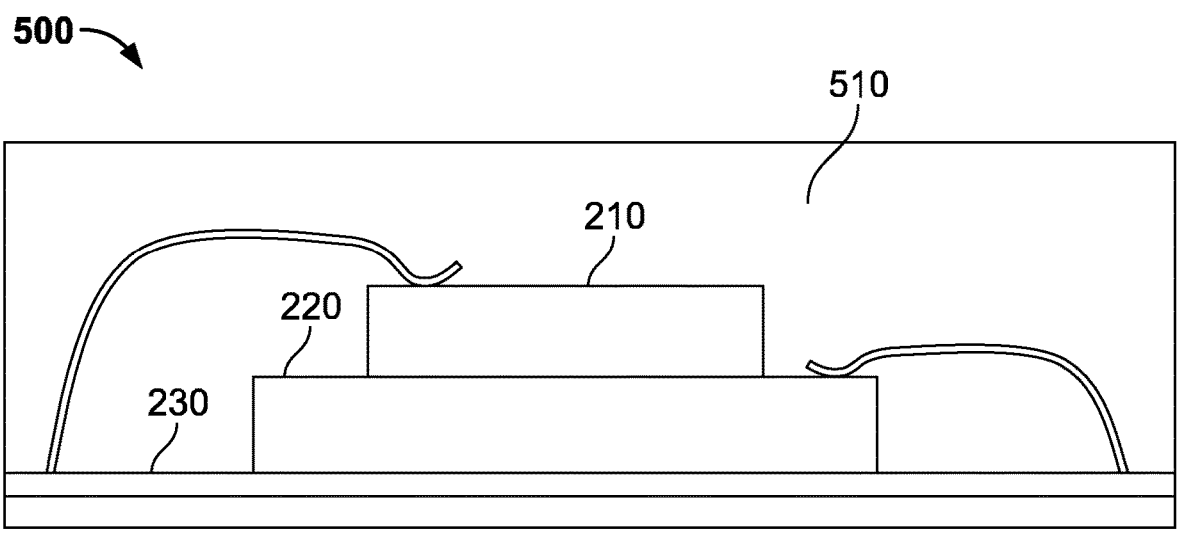
FIG. 10 is a schematic diagram of an integrated circuit package according to another embodiment.

FIG. 10 shows a schematic view of an integrated circuit package 500 according to an alternative embodiment. The integrated circuit package 500 comprises a lead frame 230, a first die comprising the first sensing element 210, and a second die comprising the second sensing element 220. The integrated circuit package 500 is covered by a housing 510.

In an embodiment, the integrated circuit package 500 additionally houses a processor, which is not shown in FIGS. 9 and 10. As discussed above, the processor computes the magnetic stray field component orthogonal to the magnetic field by comparing a first field strength computed based on a first angular data measured by the first sensing element 210 and a value of the electric current passed through the induction channel with a second field strength computed based on a second angular data measured by the second sensing element 220 and the value of the electric current passed through the induction channel.

The first magnetic sensing element 210 connected by the first channel to the processor is used to determine a first field strength and field direction of the permanent magnet field at a first distance to the magnet 310. The second magnetic sensing element 220 connected by the second channel to the processor is used to determine a second field strength and direction of the permanent magnet field at a second distance to the magnet 310. Both sensors 210, 220 determine angular data representing the same angle of rotation of the rotary member 300.

The first field strength is computed by passing two different values of the electric current through the induction channel and receiving two first angular data for the two different values of the electric current, and the second field strength is computed by passing two different values of the electric current through the induction channel and receiving two second angular data for the two different values of the electric current. Based on the first angular data, the second angular data, the first field strength, and the second field strength, an undisturbed angular value is calculated, the undisturbed angular value is equal to a magnetic field angle that is not disturbed by external disturbing fields.

The magnetic field generated by the permanent magnet 310 is interfered with an excitation field of the coil 260 in order to determine the field strength in the plane of the first sensor 210 and in the plane of the second sensor 220. As the planar coil is wound around the axis of rotation, the excitation field is always partially orthogonal to the magnetic field generated by the permanent magnet 310. This enables a compact design and reducing the computational effects for determining the field strength of the permanent magnet. Thus, both sensors 210, 220 determine a magnetic field strength, which is different due to the different distance of each sensor to the permanent magnet 310. In other words, the density of the filed vectors of the magnetic field of the permanent magnet 310 is different in the sensor plane of the first sensor 210 compared to the density of the filed vectors of the magnetic field of the permanent magnet in the sensor plane of the second sensor 220. Each sensor 210, 220 has an integrated coil 260 in order to determine the local field strength at each sensor 210, 220 by generating the coil field.

In other words, each sensor 210, 220 measures the angular position of the permanent magnet 310 with respect to its sensor plane twice, once the angular position is detected with a first excitation field and once the angular position is detected with a second excitation field. The first excitation field is different from the second excitation field. Thus, the processor can determine the field strength generated by the permanent magnet 310 in the plane of the first sensor 210 and in the plane of the second sensor 220. In an embodiment, the first excitation field is equal in its amount to the second excitation field, however, opposite in the direction of the field. For example, the value of electric current passed through the induction channel and the resulting power dissipation being equal for the both measurements, however, the direction being different.

In an external magnetic disturbing field, its disturbing influence increases with decreasing field strength at the sensor and vice versa. This leads to a difference in the measured field angles at both sensors 210, 220. Measuring the magnetic field strength generated by the permanent magnet 310 at two positions, wherein at these two positions the field density is different and measuring at both positions the field angle, enables to calculate the magnetic stray field influence generated by a disturbing source that is interfering the field of the permanent magnet 310, and thus, the influence of the stray field can be compensated.

In an embodiment, it is assumed that the distance between the disturbing source and the assembly is larger than the dimensions of the assembly. This assumption generally holds particularly true if the sensor assembly is compact and thus the field vectors of the magnetic stray field are homogenously, i.e. the field vectors of the stray field are parallel and the density of said field vectors is constant at the positions of both sensors 210, 220. Based on this assumption, the strength of the disturbing source can be calculated. In more detail, both sensors 210, 220 measure two different resulting magnetic fields, namely the field generated by the assembly, i.e. the field of the permanent magnet 310 and the excitation field of the coil 260, which is predefined and the interfering stray field generated by the disturbing source, which strength can be calculated based on the above assumption.

Figure 11:
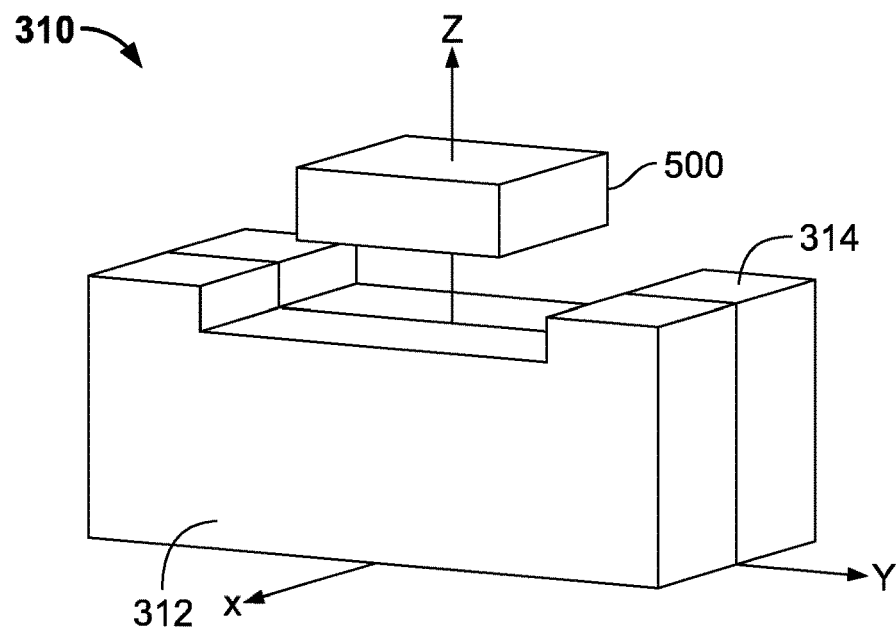
FIG. 11 is a perspective view of a permanent magnet and an integrated circuit package.
Figure 12:
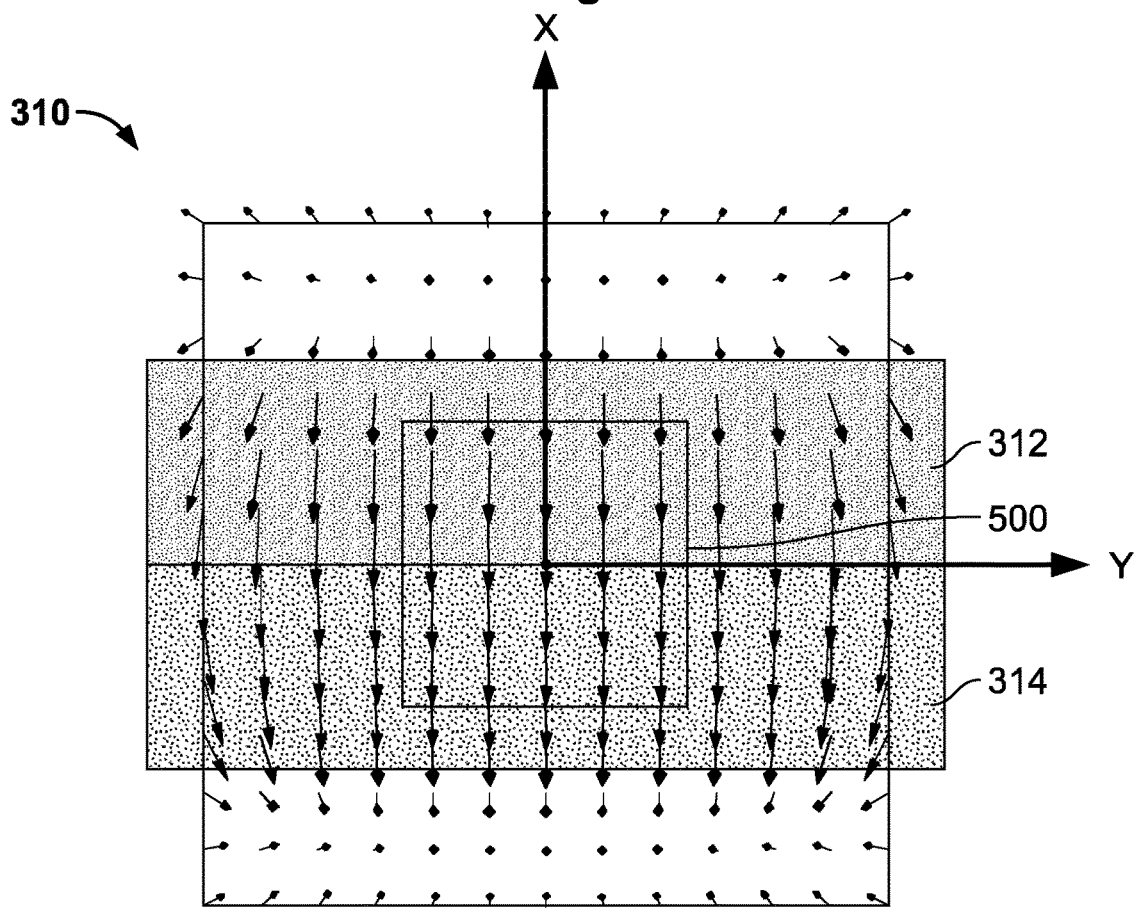
FIG. 12 is a bottom view of FIG. 11 with magnetic field vectors.

FIG. 11 shows of a schematic side view of a permanent magnet 310 and a sensing element, e.g. an integrated circuit package 500, forming partly the assembly. FIG. 12 shows bottom view of FIG. 11.

As shown in FIG. 11, the permanent magnet 310 has a U-shape. The open part of the U-shaped magnet 310 is facing the integrated circuit package 500. The arms of the U-shaped permanent magnet 310 are extending in the direction z, namely towards the integrated circuit package 500. The element interconnecting the arms is extending in the direction of y, namely parallel to the integrated circuit package 500. In an embodiment, the permanent magnet 310 has a recess at a surface facing the first magnetic sensing element 210. However, in contrast to a horseshoe magnet the opposing poles 312, 314 are also U-shaped. Such a magnet is particularly advantageous to generate a high gradient in the direction extending from the legs of the U-shaped magnet and at the same time having a nearly homogeneous field parallel to the short connecting arm of the U-shaped magnet. Thus, the volume of the magnet can be further reduced and the volume requirements for the magnet can be more easily met.

As shown in FIG. 11, the magnetic south pole 312 and the opposing magnetic north pole 314 are formed by surfaces extending in z-y direction. According to this embodiment, the axis z is the axis of rotation.

In an embodiment, the permanent magnet 310 has a short side and a long side longer than the short side. In an embodiment, the long side is 2 to 20 times longer than the short side. The magnetic south pole 312 and the magnetic north pole 314 are disposed at opposite ends of the short side. In other words, the magnet 310 is essential in the form of a rectangular cuboid forming for example a bar magnet. Thus, the volume of the magnet for generating the magnetic field, having a high divergence along the axis of rotation and being homogeneous in the sensor plane, is reduced. In another embodiment, the poles 312, 314 of the permanent magnet 310 are formed at opposite ends of the short side. In other words, the poles 312, 314 of the magnet are radial extending from the axis of rotation. The surface of the rectangular cuboid forming the opposing poles are closer to the axis of rotation than the surfaces of the rectangular cuboid comprising opposing poles.

In an embodiment, the magnet 310 has a height of 1 to 5 mm, for example 3 mm, the height is along the axis of rotation. Additionally or alternatively, the magnet 310 has a width of 1 to 5 mm, for example 3.5 mm, the width being the direction of the magnetization. Additionally or alternatively, the magnet 310 has a length of 5 to 10 mm, for example 7 mm. Additionally or alternatively, the recess has a height of 0.1 to 1 mm, for example 0.5 mm. Additionally or alternatively, the recess has a length of 1 to 4.5 mm, for example 4 mm.

Additionally or alternatively, the permanent magnet 310 is formed of rare earth materials. Thus, the volume of the magnet can be further reduced and the volume requirements for the magnet can be more easily met. On the other hand, the field strength at the sensor elements can be enhanced in order to reduce the influence of external disturbing fields on the angular measurement.

The arrows over-plotted in FIG. 12 indicate the vectors of the magnetic field generated by the permanent magnet 310 in the plane of the integrated circuit package 500. In particular, the U-shaped permanent magnet 310 with poles 312 and 340 optimizes that the field vectors of the magnetic field components in sensor plane can be assumed to be parallel within the dimensions of the integrated circuit package 500.

Although the above aspects for the assembly have been described separately, each combination enables a synergetic effect. In particular, each combination of a small sized sensor, e.g. by the embodiments disclosed with reference to FIG. 3 to 5, an optimized packaging, e.g. disclosed by the embodiments shown with reference to FIGS. 9 and 10, and an optimized magnet, e.g. by the embodiment disclosed in FIGS. 11 and 10, enables a synergetic effect. In particular, the synergetic effects are a small volume magnet that can be used for generating a parallel magnetic field perpendicular to the axis of rotation in the sensor plane having a high divergence in the direction of the axis of rotation across the assembly.

Exemplary calculations for one embodiment with a magnetic field of H0=25 kA/m and Hcoil=1 kA/m show the fact, that the output voltage changes depending on the field angle ω (°) with a 360°-periodicity. Therefore such assemblies, even when built in AMR-Technology with its 180°-periodicity, are able to detect field angles in the full 360°-range. Another important property of such an AMR-technology system is that there is no angle where more than one signal shows no coil field dependency. Therefore the three signal-change values contain in each angular position enough information to detect the field angle, especially the decision between 0-180 and 180-360°-range, as well as the total amplitude of these signal change curves. The total amplitude of the signal change curves together with the actual signal amplitude itself and the known coil field allows the calculation of the strength of the magnetic field at the sensor position. The output signals are averaged over both coil current directions. This allows a high accuracy angular detection of the field at the sensor position.

In another embodiment, the magnetoresistive layers arranged in a sensor plane with different resistance changes in the magnetic field may be realized by an angle between the resistor greater than 0° and less than 180°.

What is claimed is:

1. An assembly for determining an influence of an external disturbing magnetic stray field in a magnetic sensor detecting a rotational angle of a rotary member, comprising:
   a permanent magnet generating a magnetic field, the permanent magnet arranged on the rotary member with a magnetic south pole and a magnetic north pole of the permanent magnet generating the magnetic field perpendicular to an axis of rotation about which the rotary member rotates;
   a first channel having a first magnetic sensing element centered on the axis of rotation, the first channel providing a first angular data;
   a second channel having a second magnetic sensing element centered on the axis of rotation, the second channel providing a second angular data, the second magnetic sensing element is spaced in a direction of the axis of rotation by a predetermined distance from the first magnetic sensing element, each of the first magnetic sensing element and the second magnetic sensing element have three voltage dividers;
   an induction channel having an electromagnetic coil wound around the axis of rotation, the induction channel passing an electric current; and
   a processor configured to:
      compute a first field strength based on the first angular data received by the first channel and a value of the electric current passed through the induction channel;
      compute a second field strength based on the second angular data received by the second channel and the value of the electric current passed through the induction channel; and
      compute a magnetic stray field component orthogonal to the magnetic field by comparing the first field strength with the second field strength.

2. The assembly of claim 1, wherein each of the voltage dividers has a pair of resistors formed by magnetoresistive layers arranged in a sensor plane with opposing resistance changes in the magnetic field.

3. The assembly of claim 2, wherein each of the voltage dividers has a first conducting path forming a first resistor of the pair of resistors and a second conducting path arranged perpendicular to the first conducting path and forming a second resistor of the pair of resistors.

4. The assembly of claim 1, wherein a plurality of windings of the electromagnetic coil form triangle shapes.

5. The assembly of claim 1, wherein a first electromagnetic coil and the first sensing element are fabricated as an integrated circuit forming a first die.

6. The assembly of claim 5, wherein a second electromagnetic coil and the second sensing element are fabricated as an integrated circuit forming a second die.

7. The assembly of claim 6, wherein the first die is positioned atop the second die to form an integrated circuit package.

8. The assembly of claim 7, wherein a top contacting surface of the integrated circuit package faces the permanent magnet.

9. The assembly of claim 8, wherein a bottom contacting surface of the integrated circuit package faces a circuit board.

10. The assembly of claim 7, wherein a first contact arrangement of the first magnetic sensing element in the integrated circuit package is connected to a lead frame by a first technique.

11. The assembly of claim 10, wherein a second contact arrangement of the second magnetic sensing element in the integrated circuit package is contacted by a second technique different from the first technique.

12. The assembly of claim 11, wherein the first technique is wire bonding and the second technique is connecting by flip chip.

13. The assembly of claim 11, wherein the integrated circuit package, the lead frame, and the processor are covered by a housing.

14. The assembly of claim 1, wherein the permanent magnet has a short side and a long side longer than the short side, the long side is 2 to 20 times longer than the short side.

15. The assembly of claim 14, wherein the magnetic south pole and the magnetic north pole are disposed at opposite ends of the short side.

16. The assembly of claim 1, wherein the permanent magnet has a recess at a surface facing the first magnetic sensing element.

17. The assembly of claim 1, wherein the magnetic south pole and the magnetic north pole are located on a side of the magnet facing the magnetic sensor and on both sides of the axis of rotation.

18. A method for sensing a strength of an external disturbing magnetic stray field in a magnetic sensor detecting a rotational angle of a rotary member, comprising:
providing an assembly including:
- a permanent magnet generating a magnetic field, the permanent magnet arranged on the rotary member with a magnetic south pole and a magnetic north pole of the permanent magnet generating the magnetic field perpendicular to an axis of rotation about which the rotary member rotates;
- a first channel having a first magnetic sensing element centered on the axis of rotation, the first channel providing a first angular data;
- a second channel having a second magnetic sensing element centered on the axis of rotation, the second channel providing a second angular data, the second magnetic sensing element is spaced in a direction of the axis of rotation by a predetermined distance from the first magnetic sensing element, each of the first magnetic sensing element and the second magnetic sensing element have three voltage dividers;
- an induction channel having an electromagnetic coil wound around the axis of rotation, the induction channel passing an electric current; and
- a processor;
computing, with the processor, a first field strength based on the first angular data received by the first channel and a value of the electric current passed through the induction channel;
computing, with the processor, a second field strength based on the second angular data received by the second channel and the value of the electric current passed through the induction channel; and
computing, with the processor, a magnetic stray field component by comparing the first field strength with the second field strength.

19. The method of claim 18, wherein the first field strength is computed by passing two different values of the electric current through the induction channel and receiving two first angular data for the two different values of the electric current, and the second field strength is computed by passing two different values of the electric current through the induction channel and receiving two second angular data for the two different values of the electric current.

20. The method of claim 18, wherein, based on the first angular data, the second angular data, the first field strength, and the second field strength, an undisturbed angular value is calculated, the undisturbed angular value is equal to a magnetic field angle that is not disturbed by external disturbing fields.

* * * * *